US006986098B2

(12) United States Patent
Poeppelman et al.

(10) Patent No.: US 6,986,098 B2
(45) Date of Patent: Jan. 10, 2006

(54) METHOD OF REDUCING MISCORRECTIONS IN A POST-PROCESSOR USING COLUMN PARITY CHECKS

(75) Inventors: Alan D. Poeppelman, Fort Collins, CO (US); David L. Schell, Fort Collins, CO (US); Kevin G. Christian, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 943 days.

(21) Appl. No.: 10/015,181

(22) Filed: Nov. 20, 2001

(65) Prior Publication Data

US 2003/0103586 A1    Jun. 5, 2003

(51) Int. Cl.
*G06F 11/00*    (2006.01)
*H03M 13/00*    (2006.01)
(52) U.S. Cl. .................................................. 714/807
(58) Field of Classification Search ........ 714/799–802, 714/807, 755, 758
See application file for complete search history.

(56) References Cited

U.S. PATENT DOCUMENTS

| | | | |
|---|---|---|---|
| 6,434,719 B1 * | 8/2002 | Livingston | 714/804 |
| 6,513,141 B1 * | 1/2003 | Livingston | 714/792 |
| 6,625,774 B1 * | 9/2003 | Yang | 714/755 |
| 6,654,924 B1 * | 11/2003 | Hassner et al. | 714/758 |
| 6,694,477 B1 * | 2/2004 | Lee | 714/784 |
| 6,757,862 B1 * | 6/2004 | Marianetti, II | 714/774 |

* cited by examiner

*Primary Examiner*—Shelly Chase
(74) *Attorney, Agent, or Firm*—Suiter West PC

(57) ABSTRACT

The present invention is a method and system for reducing miscorrections of data in a post-processor. In an embodiment of the invention, the system and method may compare a result of an exact match function and a metric for each row of a reconstructed data block to determine if a correction should be made. An algorithm for performing an exact match function may include a column parity check syndrome, a matched filter error syndrome, and an error mask of the present invention. If a result of an exact match function is an exact match, a priority of correction may be given to the row in which the exact match was produced.

18 Claims, 4 Drawing Sheets

METHOD OF REDUCING MISCORRECTIONS IN A POST-PROCESSOR USING COLUMN PARITY CHECKS

FIELD OF THE INVENTION

The present invention relates generally to communication receivers and more specifically to a system and method of reducing miscorrections in a post-processor using column parity checks.

BACKGROUND OF THE INVENTION

Read channel integrated circuits may include significant digital signal processing after an analog signal has been received. A post-processor module is generally utilized to improve a bit error rate (BER) performance of the read channel over what a Viterbi detector may be capable of solely. A post-processor module receives a data stream from the Viterbi detector and makes corrections to the data based on additional information provided by coding redundancy, error event matched filter metrics, or additional Viterbi detector data.

Post-processors known to the art utilize matched filters to generate error event data and metrics for each row. A list of most probable error events with even and odd parity are maintained for each row. A row process is performed to enforce row parity and a column process is performed in an attempt to enforce all column parity. A column correction process is utilized to alter the data received from the Viterbi detector in order to remove errors. The column correction process includes determing a column parity check syndrome and checking all even parity error events from the list for the one which matches the syndrome the most. However, the column correction process known to the art miscorrects data too frequently. The miscorrection of data leads to a BER which is higher than desired and adversely affects the performance of the error correction code. Consequently, an improved method and system for reducing miscorrections of data in a post-processor is necessary.

SUMMARY OF THE INVENTION

Accordingly, the present invention is directed to a novel system and method for reducing miscorrections of data in a post-processor. In an embodiment of the invention, an error mask of the present invention may be produced utilizing a matched filter error syndrome. Error masks may define a vicinity of the column parity check syndrome for which the matched filter error syndromes should be compared against. Through a comparison of the column parity check syndrome, matched filter error syndrome, and an error mask, an exact match function may be performed and may produce a result. The result of the exact match function and related metrics may be weighed by the system of the present invention to determine if a correction should be made for each row of a data block.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to an embodiment of the invention, examples of which are illustrated in the accompanying drawings.

Figure 1:
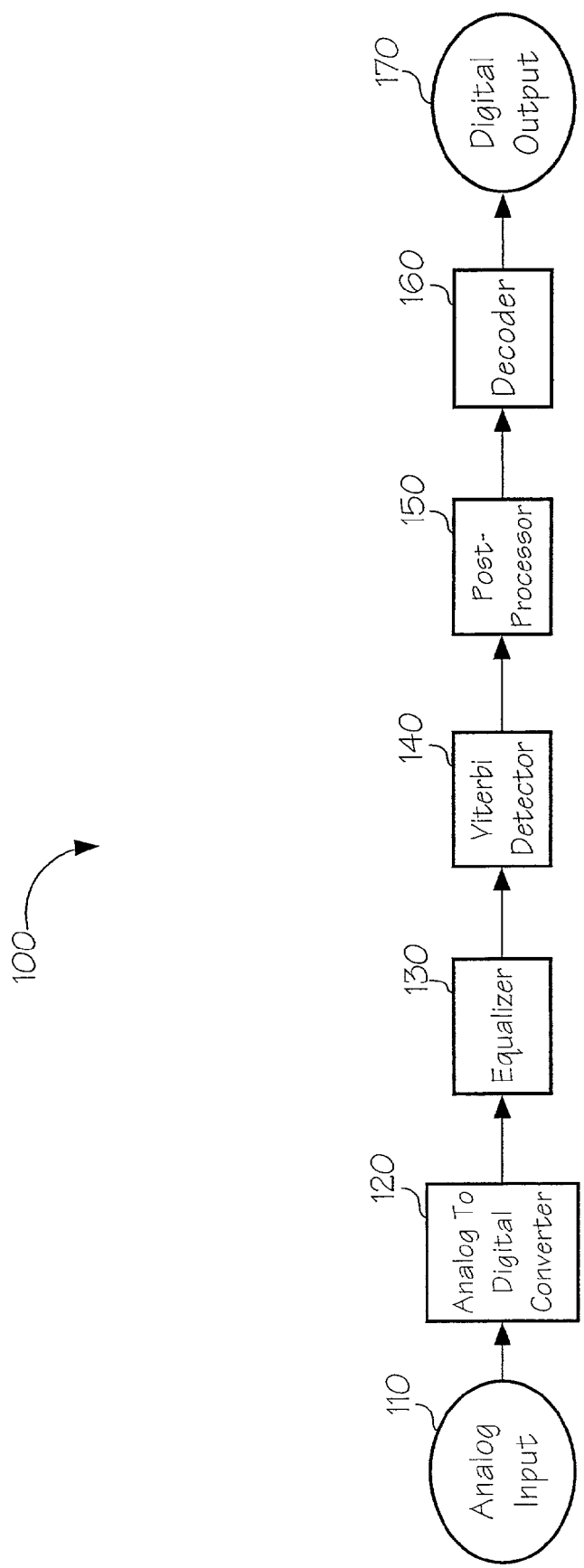
FIG. 1 depicts an embodiment of digital signal processing system known to the art.

Referring to FIG. 1, an embodiment of digital signal processing system known to the art is shown. The digital processing system 100 may be illustrative of processing systems utilized in read channels and communications receivers. Digital processing system 100 may receive an analog input signal 110 which may be converted to a digital signal by an analog to digital converter 120. The digital signal may be fed through an equalizer 130 and into a Viterbi detector 140. Viterbi detector 140 may include a processor which may implement a Viterbi algorithm. Viterbi detectors 140 are widely known in the art for decoding convolutional codes in baseband and may be utilized in wireless systems and for detection of recorded data in magnetic disk drives.

A post-processor 150 may also be included within processing system 100 to improve a bit error rate (BER) performance over what may be possible by the Viterbi detector 140 solely. Post-processor 150 may make corrections to data received from the Viterbi detector 140 based on additional information provided by coding redundancy, error event matched filter metrics, and additional Viterbi detector data. For example, post-processor 150 may maintain a list of most probable error events with even and odd parity kept for each row. A row process is performed to enforce row parity and a column process is performed in an attempt to enforce column parity. A column correction process performed by post-processor 150 calculates a column parity check syndrome and checks all even parity error events from the list of most probable error events. Actual error events which create the column parity check syndrome may not be included in the list of most probable error events. Thus, post-processor 150 may produce output data with an undesirable number of miscorrections that is received by decoder 160, which in turn, generates a digital output signal 170.

Figure 2:
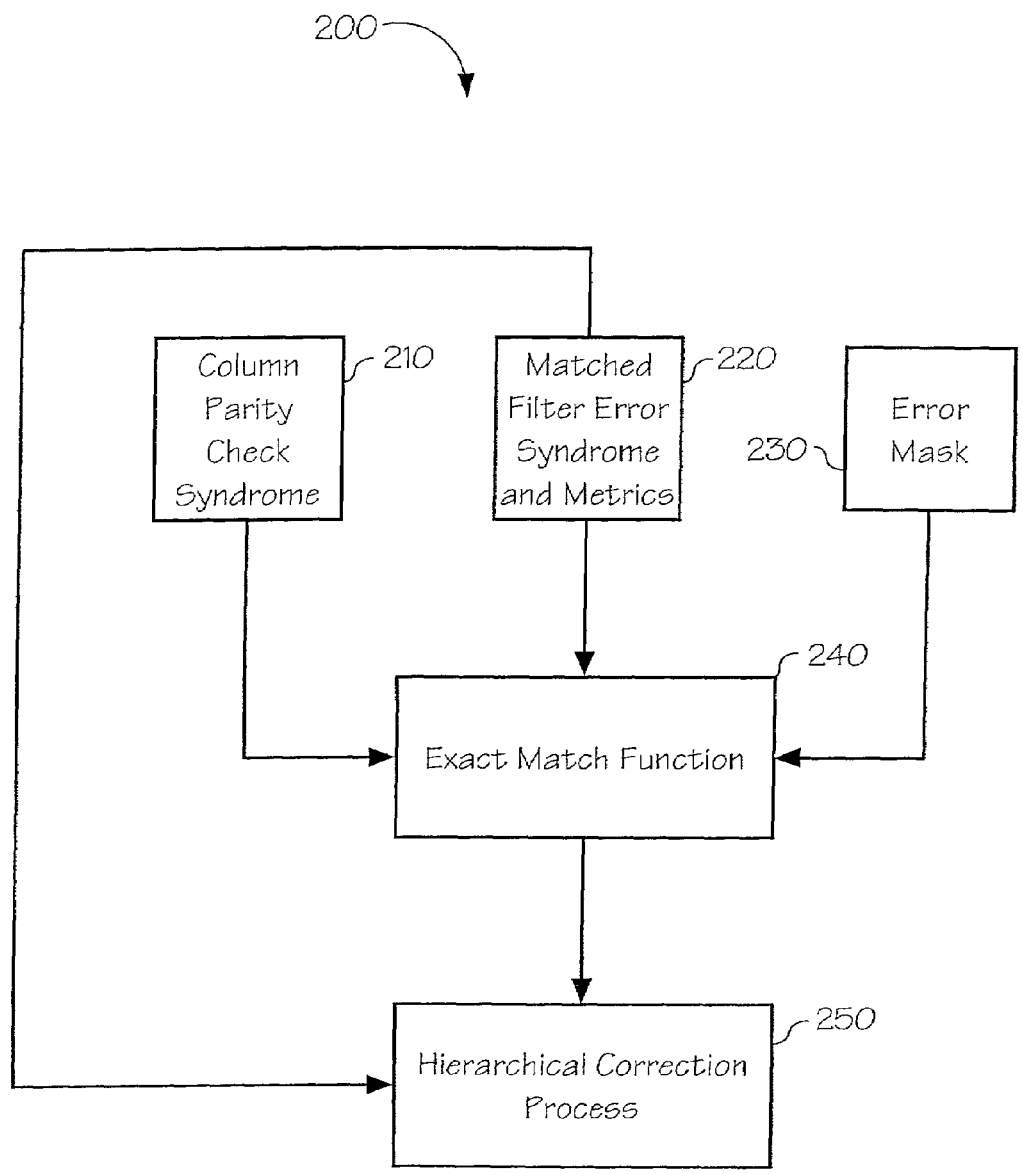
FIG. 2 depicts an embodiment of a process for making a correction of data performed by a post-processor of the present invention.

Referring now to FIG. 2, an embodiment of a process 200 for making a correction of data performed by a post-processor of the present invention is shown. A post-processor of the present invention may reference a column parity check syndrome 210, a matched filter error syndrome and metrics 220, and an error mask 230. A column parity check syndrome may be determined by checking each column of a block of data for even parity. A matched filter error syndrome may provide the most probable error events and metrics may refer to a measure of the likelihood that a piece of data is suspect. An error mask 230 associated with a matched filter error syndrome and metrics 220 may define a vicinity of column parity check syndrome 210 for which matched filter error syndromes should be compared against.

Through a comparison of column parity check syndrome 210, matched filter error syndrome and metrics 220, and an error mask, an exact match function 240 may be performed. An exact match function may produce a result which is an exact match. If an exact match is produced, priority may be given to correction of data corresponding to the row in which an exact match was produced. The exact match information may be utilized with error event metrics obtained from a matched filter error syndrome to create a hierarchical correction process 250. An example of a hierarchical correction process 250 may be to correct all exact matches first and if no exact matches exist, then to correct the errors which reduce the column parity check syndrome the most if the metric is sufficiently high.

Figure 3:
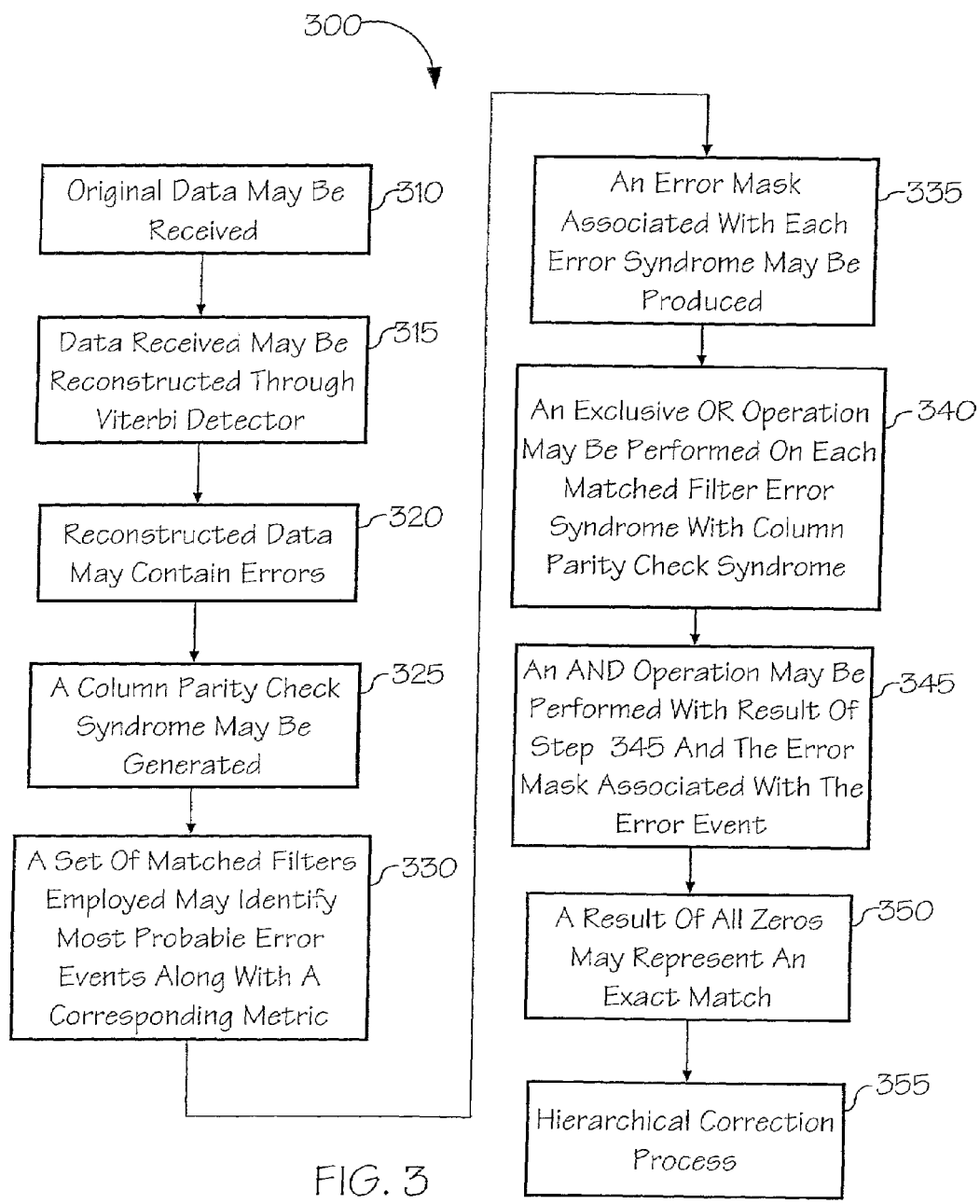
FIG. 3 depicts an example of the process for making a correction of data as shown in FIG. 2 in accordance with the present invention.

Referring to FIG. 3, an example of the process 300 for making a correction of data as shown in FIG. 2 in accordance with the present invention is shown. Process 300 may begin when original data may be received 310. Original data may be in the form of a block of data. For example, the original data may include three rows of sixteen bits. Data may be arranged in a rectangular array with a parity bit for each row and column as shown below. The value of the parity bits may enforce a fixed parity on each row and column.

Original Data

1000000011001101|0
1010111000101011|1
0110111001101010|1
0100000010001100|0

While a block of data including three rows and 16 bits per row is shown for exemplary purposes, it should be understood by one of ordinary skill in the art that the present invention may support all types of blocks of data without departing from the scope and spirit of the present invention. Data may be reconstructed through a Viterbi detector or similar device 315. The reconstructed data may be represented as shown below.

Reconstructed Data

1010100011001101|0
1010111001010011|1
0110111001101010|1
0100000010001100|0

Reconstructed data may include errors 320. As shown above, the reconstructed data has two bit errors in row one and four bit errors in row two. Each column of reconstructed data may be checked for even parity in order to generate a column parity check syndrome 325. The column parity check syndrome for this example may be represented as shown below.

Column Parity Check Syndrome
0010100001111000

As the column parity check syndrome is different than the column parity of the original data, it may signal that errors in the reconstructed data are present. A set of matched filters employed may identify a list of most probable error events along with a corresponding metric 330 for each row of the reconstructed data block. A metric may represent a measure of a likelihood that a bit is suspect. A matched filter error syndrome and associated metric, created from a list of most probable errors and metrics, may be represented in this example as shown below.

Matched Filter Error Syndrome And Metrics

Row 1 0010100000000000 Metric = −4

Row 2 0000111111000000 Metric = −3

Row 3 0000000000110000 Metric = −3

As row 1 has a metric of −4, the bits of row 1 are likely more suspect than rows 2 and 3 with a metric of −3. Thus, the bits represented by 1s (one) in the matched filter error syndrome may be changed in the reconstructed data in order to reproduce the original data. In row 1, the matched filter error syndrome matches the error in row 1 from the original data to the reconstructed data. The matched filter error syndrome for row 3 may have corrected column parity for the reconstructed data, however, this would have resulted in a miscorrection to Row 3 which may have been propagated an additional error in the block of data.

An error mask associated with each matched filter error syndrome may be produced 335. An error mask may define the vicinity of the column parity check syndrome for which the matched filter error syndrome should be checked against. In an embodiment of the invention, an error mask may be created from the error syndromes by using combinatorial logic. For example, an error mask may be created by the following Error Mask[$n$]=Error Syndrome[$n$]+Error Syndrome [$n$−1]+Error Syndrome[$n$+1] +(Error Syndrome [$n$−2]* Error Syndrome[$n$+2]) where +represents an Or operation and * represents an AND operation.     Equation 1

Utilizing equation 1 on the exemplary matched filter error syndrome, an error mask may be produced as shown below.

Error Mask

Row 1 0111110000000000

Row 2 0001111111100000

Row 3 0000000001111000

An exact match function may be performed. In an embodiment of the present invention, one method of performing an exact match function may include performing an exclusive OR operation (XOR) for each matched filter error syndrome with the column parity check syndrome 340. An AND operation of the result of the XOR operation with the error mask associated with the error event may also be performed 345. If the result of the AND operation is all zeros, an exact match has been determined 350. The result of the exact match function may be utilized with the error event metrics to create a hierarchical correction process 355 as described with respect to FIG. 2.

A representation of the calculations for performing an exact match function in order to produce a masked syndrome comparison is shown on the following page.

| Masked Syndrome Comparison Results | |
|---|---|
| Row 1 Matched Filter Error Syndrome | 0010100000000000 |
| Column Parity Check Syndrome | 0010100001111000 |
| XOR | 0000000001111000 |
| Row 1 Error Mask | 0111110000000000 |
| 1st Result | 0000000000000000 |
| Row 2 Matched Filter Error Syndrome | 0000111111000000 |
| Column Parity Check Syndrome | 0010100001111000 |
| XOR | 0010011110111000 |
| Row 2 Error Mask | 0001111111100000 |
| 2nd Result | 0000011110100000 |
| Row 3 Matched Filter Error Syndrome | 0000000000110000 |
| Column Parity Check Syndrome | 0010100001111000 |
| XOR | 0010100001001000 |
| Row 3 Error Mask | 0000000001111000 |
| 3rd Result | 0000000001001000 |

The result for row 1 produced an exact match, thus, a correction for row 1 may be performed as an exact match may represent that the errors should be corrected. While process 300 depicts an exemplary method of performing an exact match calculation of the present invention, other methods of obtaining a desired check to determine if a correction should occur may be accomplished by one of ordinary skill in the art without departing from the scope and spirit of the present invention.

Figure 4:
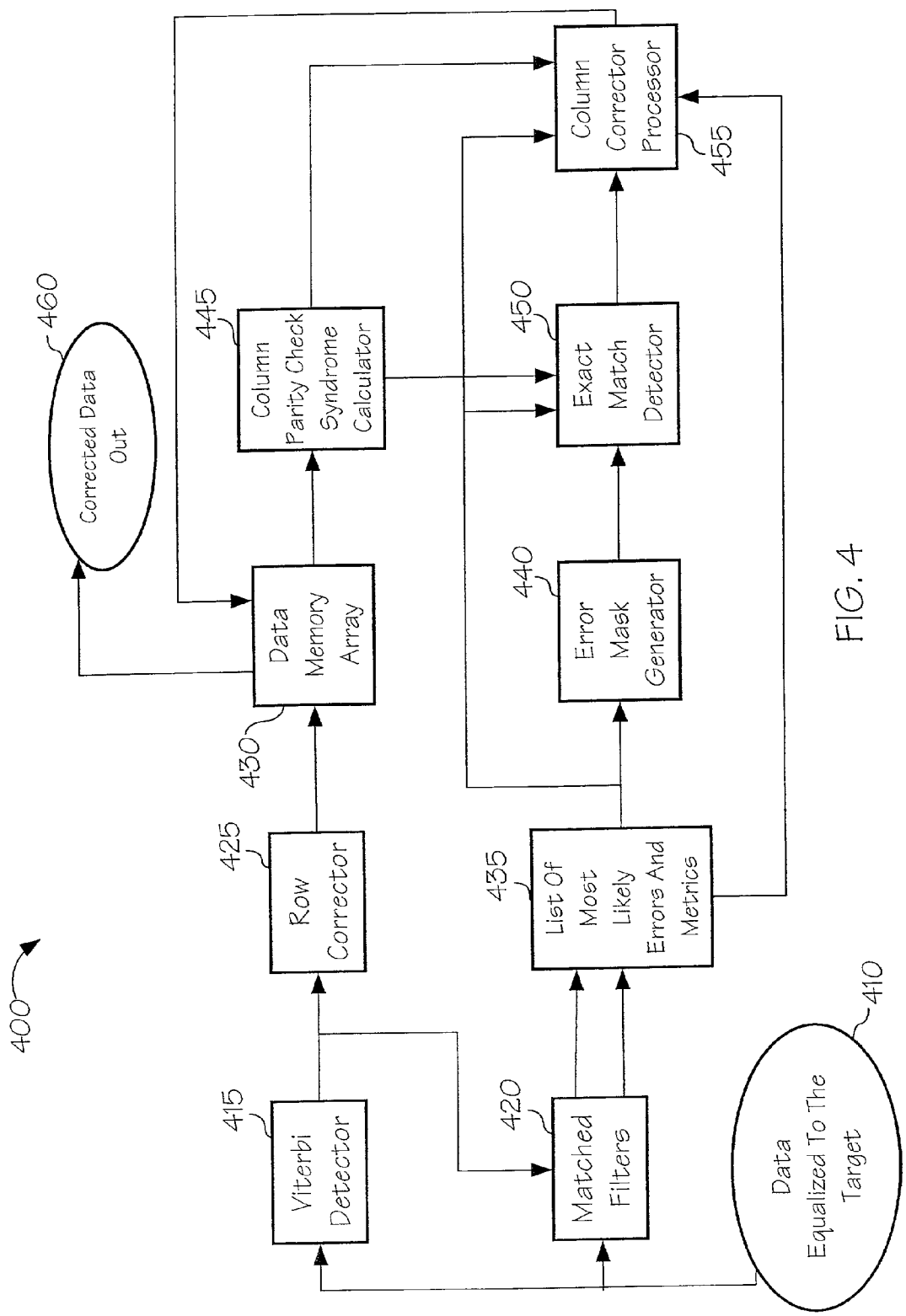
FIG. 4 depicts an embodiment of a digital signal processing system of the present invention.

Referring now to FIG. 4, an embodiment of a digital signal processing system 400 of the present invention is shown. Data equalized to the target 410 may refer to original data received and has been transferred through an equalizer. Data equalized to the target 410 may be received by Viterbi detector 415 and may also be received by matched filters 420. The output of Viterbi detector 415 may be delivered to a row corrector 425 which may ensure row parity. The output of row corrector 425 may be sent to a data memory array 430 for storage.

The output of Viterbi detector 415 may also be sent to matched filters 420. The matched filters 420 may produce a list of most likely errors and metrics 435, or otherwise referred to as matched filter error syndrome and metrics from data equalized to the target 410 and output of Viterbi detector 415. The list of most likely errors may be utilized in the error mask generator 440 as described in the description of FIGS. 2 and 3. Column parity check syndrome calculator 445 produces the column parity check syndrome. The column parity check syndrome may be sent to exact match detector 450. Exact match detector 450 may include a state machine to perform an algorithm in order to perform an exact match function. The result of an exact match function may be sent to column corrector processor 455 to perform a hierarchical correction process of FIGS. 2 and 3 by weighing a metric of matched filter error syndrome, column parity check syndrome, and the result of an exact match function. Output of column corrector processor 455 may be delivered to data memory array 430 to form and store a corrected data out 460.

Digital signal processing system 400 may be implemented in various ways in order to reduce miscorrections in a post-processor. Further, it should be understood that each of the modules may not be specifically present in digital processing system 400 of the present invention, rather, the embodiment of digital processing system 400 may represent an embodiment of the functional aspects of the present invention.

Further, it is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of correcting data; comprising;
   (a) decoding a received data block to form a reconstructed data block;
   (b) determining a column parity of each column of said reconstructed data block;
   (c) producing a list of most probable errors and an associated metric for relating to each row of said reconstructed data block;
   (d) creating an error mask utilizing said list of most probable errors; and
   (e) performing an exact match function for each row of said reconstructed data block; wherein a result of said exact match function and said associated metric are compared to determine if a correction of a bit of said reconstructed data block is made for each row.

2. The method as claimed in claim 1, wherein decoding of said received data block includes transfer of said received data block through a Viterbi detector.

3. The method as claimed in claim 1, wherein said producing of said list of most probable errors and said associated metric is accomplished by sending said reconstructed data block through a set of matched filters.

4. The method as claimed in claim 1, wherein determining of said column parity of each column of said reconstructed data block creates a column parity check syndrome.

5. The method as claimed in claim 4, wherein said error mask defines a vicinity of said column parity check syndrome for which said list of most probable errors should be checked against.

6. The method as claimed in claim 4, wherein calculating of said exact match function comprises:
   (a) performing an exclusive OR operation with said list of most probable errors and said column parity check syndrome to create a first result; and
   (b) performing an AND operation with said first result and said error mask to create a second result, wherein said second result is a result of said exact match function.

7. The method as claimed in claim 1, wherein a priority of correction is given to a row in which said result of said exact match function is an exact match.

8. A method of accurately correcting data; comprising;
   (a) decoding a received data block to form a reconstructed data block;
   (b) determining a column parity of each column of said reconstructed data block to form a column parity check syndrome;
   (c) producing a list of most probable errors and an associated metric for relating to each row of said reconstructed data block;

(d) creating an error mask utilizing said list of most probable errors;

(e) performing an exclusive OR operation with said list of most probable errors and said column parity check syndrome to create a first result; and (f) performing an AND operation with said first result and said error mask to create a second result, wherein said second result is a result of an exact match function, said result of said exact match function and said associated metric being compared to determine if a correction of a bit of said reconstructed data block is made for each row.

9. The method as claimed in claim 8, wherein decoding of said received data block includes transfer of said received data block through a Viterbi detector.

10. The method as claimed in claim 8, wherein said producing of said list of most probable errors and said associated metric is accomplished by sending said reconstructed data block through a set of matched filters.

11. The method as claimed in claim 8, wherein said error mask defines a vicinity of said column parity check syndrome for which said list of most probable errors should be checked against.

12. The method as claimed in claim 8, wherein a priority of correction is given to a row in which said result of said exact match function is an exact match.

13. A digital processing system, comprising:
(a) means for decoding a received data block to form a reconstructed data block;
(b) means for producing a list of most probable errors and an associated metric relating to each row of said reconstructed data block; said producing means being coupled to said decoding means;
(c) means for determining a column parity of said reconstructed data block to form a column parity check syndrome;
(d) means for creating an error mask coupled to said producing means; and
(e) means for performing an exact match function to produce a result; said means for performing an exact match being coupled to said means for determining a column parity and said means for producing a list of most probable errors and an associated metric; and
(f) means for correcting data of said reconstructed data block; wherein said correcting means compares said result of said exact match function and said associated metric to determine if a correction of a bit of a row of said reconstructed data block is made.

14. The digital signal processing system as claimed in claim 13, wherein said decoding means includes a Viterbi detector.

15. The digital signal processing system as claimed in claim 13, wherein said producing means includes a set of matched filters which receives said reconstructed data block.

16. The digital signal processing system as claimed in claim 13, wherein said error mask defines a vicinity of said column parity check syndrome for which said list of most probable errors should be checked against.

17. The digital signal processing system as claimed in claim 13, wherein said exact match function includes an exclusive OR operation with said list of most probable errors and said column parity check syndrome and an AND operation of a result of said exclusive OR operation with said error mask.

18. The digital signal processing system as claimed in claim 13, wherein a priority of correction is given to a row in which said result of said exact match function is an exact match.

* * * * *